United States Patent
Deng

(10) Patent No.: US 6,172,570 B1
(45) Date of Patent: Jan. 9, 2001

(54) LASER LIGHT QUANTUM SYSTEM

(75) Inventor: Jinquan Deng, Irvine, CA (US)

(73) Assignee: Datum, Inc., Irvine, CA (US)

( * ) Notice: Under 35 U.S.C. 154(b), the term of this patent shall be extended for 0 days.

(21) Appl. No.: 09/379,478

(22) Filed: Aug. 23, 1999

(51) Int. Cl.[7] .............................. H03L 7/26; H03B 17/00; H01S 1/06

(52) U.S. Cl. .............................................. 331/3; 331/94.1

(58) Field of Search ........................ 331/3, 94.1

(56) References Cited

U.S. PATENT DOCUMENTS

| | | | |
|---|---|---|---|
| 4,123,727 | 10/1978 | Peters ..................................... | 331/94 |
| 4,349,798 | 9/1982 | Podell et al. ........................... | 333/230 |
| 4,446,429 | 5/1984 | Frocisz et al. ........................ | 324/316 |
| 4,495,478 | 1/1985 | Kwon et al. ........................... | 333/230 |
| 4,633,180 | 12/1986 | Biehl et al. ........................... | 324/316 |
| 4,947,137 | 8/1990 | Busca et al. .......................... | 331/94.1 |
| 5,192,921 | 3/1993 | Chantry et al. ......................... | 331/3 |
| 5,387,881 | 2/1995 | Schweda et al. ..................... | 331/94.1 |
| 5,491,451 | * 2/1996 | English ..................................... | 331/3 |
| 5,751,193 | * 5/1998 | Nakajima et al. ........................ | 331/3 |

FOREIGN PATENT DOCUMENTS

| | | | |
|---|---|---|---|
| 0 330 954 | 6/1989 | (EP) ................................ | H06L/7/26 |

OTHER PUBLICATIONS

Split–ring Resonator for Use in Magnetice Resonance from 200–2000 MHz; W.N. Hardy and L.A. Whitehead, Review of Scientific Instruments, vol. 52, pp. 213–216 (1981).

The Loop–Gap Resonator: A New Microwave Lumped Circuit ESR Sample Structure; W. Froncisz and James S. Hyde; Journal of Magnetic Resonance vol. 47, pp. 515–521 (1982).

Experimental Results on a Frequency Standard Based on a Rubidium 87 Maser; Proceedings of the 39th Annual Symposium on Frequency Control; M. Tetu et al, pp. 64–71 (1985).

A Miniaturized Microwave Resonator for Rubidium Frequency Standards; G.H. Mei and J.T. Liu; Paper at Joint Meeting of Frequency and Time Forum in Besancon, France; one page, (Apr., 1999).

(List continued on next page.)

*Primary Examiner*—David Mis
(74) *Attorney, Agent, or Firm*—Brinks Hofer Gilson & Lione

(57) ABSTRACT

A quantum medium is excited by laser light from a first electromagnetic source and is also exposed to radiation from a second electromagnetic source such that the radiation field from this second source is non-uniform in a direction transverse to the direction of passage of laser light though the quantum medium. The laser light that has passed through the quantum medium is detected by two photo detectors at two different locations transverse to the passage of laser light, with the light detected by each photo detector having passed through a substantially different region of the quantum medium than the light detected by the other photo detector, and with the radiation field from the second electromagnetic source having different intensities in these two regions. The different radiation field intensities in these two regions produce at each photo detector different intensity levels of the laser light that varies with the frequency of the second source of electromagnetic radiation. The two photo detectors convert light variations at the locations into two electrical signals so that by combining the two signal outputs, any amplitude-dependent noise present in the laser light at the locations of the photo detectors may be reduced or cancelled, without at the same time obliterating the signal that varies with the frequency of the second source of electromagnetic radiation.

25 Claims, 4 Drawing Sheets

OTHER PUBLICATIONS

Coherent Microwave Emission Without Population Inversion: A New Atomic Frequency Standard; Aldo Godone, Filipo Levi and Jacques Vanier; IEEE Transaction on Instrumentation and Measurement, vol. 48, pp. 504–507 (1999).

Recent Progress in Laser–Pumped Rubidium Gas Cell Frequency Standards; G. Mileti et al; 1996 IEEE International Frequency Control Symposium; pp. 1066–1072 (1996).

* cited by examiner

LASER LIGHT QUANTUM SYSTEM

FIELD OF INVENTION

This invention relates to quantum frequency apparatus and more particularly relates to physics packages for laser-pumped gas-cell atomic frequency standards, and still more particularly, to noise cancellation in such systems.

BACKGROUND OF INVENTION

Modern telecommunication systems require extremely stable and accurate timing devices, with the overall size, operating temperature, power consumption, weight, and ruggedness of the device being critical parameters. Quantum frequency apparatus, such as atomic frequency standards, are used in such applications.

In quantum frequency apparatus of the type considered here, a quantum medium is excited by two sources of electromagnetic energy. The "quantum medium" can be any gaseous, vaporous, liquid or solid material that exhibits natural resonances (referred to herein from time to time as "selected reference frequencies,") and that can be used for the purpose of optically detecting its natural resonances. The first source of electromagnetic energy can be light energy that is used to optically excite the medium, and the second source of electromagnetic energy can be a coherent source of electromagnetic radiation that is used to excite a selected reference frequency (i.e., a "natural resonance") of the medium. The optical excitation takes place in such a way that the light from the first source is both absorbed and transmitted by the quantum medium, with the portion of the light that is transmitted depending on the frequency difference between the selected reference frequency and the frequency of the electromagnetic radiation from the second source. This type of process is referred to from time to time herein as an optically-detected quantum resonance.

Atomic frequency standards, for example, use natural resonances within atoms to keep time since the natural atomic resonances (selected reference frequencies) are more stable and less sensitive to environmental effects, such as temperature, pressure, humidity, vibration, acceleration, etc., than are macroscopic oscillators like pendulums and quartz crystals. This type of natural atomic resonance, operating at a selected reference frequency, is used as a highly stable frequency reference to which the frequency of a variable frequency oscillator, such as a quartz oscillator, can be electronically locked so the high stability and relative insensitivity to environmental perturbations of such a natural atomic resonance are transferred to the quartz oscillator.

The atomic frequency standards usually comprise a voltage controlled oscillator (VCO), and a physics package and associated electronics that maintain an accurate and stable VCO standard frequency on a long-term basis. The physics package and associated electronics are used to slave the VCO to the frequency of the atomic resonance, thereby reducing frequency drift due to oscillator aging and the effects of the environment on the oscillator.

In a passive (Rb or Cs) gas-cell atomic frequency standard, the physics package includes a gas-exciting light source, a transparent glass cell containing an atomic gas and situated in a microwave cavity, and a photo detector. The microwave cavity is commonly used to couple injected electromagnetic energy at about the selected reference frequency to the atoms of the atomic gas, such as Rb or Cs, within the transparent cell. The microwave cavity is designed to have a microwave resonant frequency substantially equal to the selected reference frequency to optimize the effect of the injected electromagnetic field on the atomic gas in the cell. The injected microwave electromagnetic field is generated by frequency multiplication and synthesis from the VCO output.

In operation the atomic gas within the transparent glass cell is excited by the light from the gas-exciting light source. The microwave electromagnetic energy injected into the microwave cavity interacts with the excited atoms within the transparent cell and varies the intensity of the light transmitted through the gas cell in a manner dependent on the difference between the injected microwave frequency and the selected reference frequency. The light intensity transmitted through the gas cell is sensed by the photo detector and the variation in light intensity is detected and converted by the photo detector into a physics package electrical signal output. The physics package thus provides a frequency discriminating electrical output signal dependent upon the difference between the injected microwave frequency (which has been synthesized from the VCO frequency) and the stable selected reference frequency, which is used to lock the VCO frequency to this selected atomic resonant frequency.

Starting in the 1980s, there has been considerable interest in the use of semiconductor diode lasers in atomic frequency standards In gas-cell atomic frequency standards, the rf-discharge lamp is replaced by a semiconductor diode laser to reduce size, lower power consumption and costs.

However, these lasers tend to have relatively high FM noise. This laser FM noise is converted into AM noise by the atoms of the physics package and appears as such on its electrical signal output. This AM noise resulting from the conversion of laser light FM noise plus the laser AM noise have an adverse effect on the short-term frequency stability of the atomic standard, which can easily be an order of magnitude higher than for a conventional lamp-pumped standard, depending on the type of the laser.

As described in the paper "Recent Progress in Laser-Pumped Rubidium Gas-Cell Frequency Standards", G. Mileti, et al., tested the possibility of reducing this AM noise in a passive way. With a beam splitter, the laser light was separated into two beams. One beam, the signal beam, was passed through a first resonance cell with microwave interrogation to provide a first physics package signal. The other beam, the sample beam, was passed through a second atomic gas cell (identical to the first one, but without microwave interrogation) to provide a second physics package output signal. Noise reduction was sought by subtracting the first and second signals produced by these two beams so that the correlated AM noise was cancelled while the signal remained. Two ovens and two atomic gas cells are needed in this scheme. Also, the noise cancellation is dependent on the extent to which the light absorption environments in these two cells are identical.

SUMMARY OF THE INVENTION

This invention uses the ability of a single physics package to act as a transducer in the generation of a low noise output from the noisy light input of a laser diode.

In this invention, a quantum medium is excited by laser light from a first electromagnetic source and is also exposed to radiation from a second electromagnetic source such that the radiation field from this second source is non-uniform in a direction transverse to the direction of passage of laser light though the quantum medium. The laser light that has passed through the quantum medium is detected by two photo detectors at two different locations transverse to the passage of laser light, with the light detected by each photo detector having passed through a substantially different region of the quantum medium than the light detected by the other photo detector, and with the radiation field from the second electromagnetic source having different intensities in these two regions. The different radiation field intensities in these two regions produce at each photo detector different intensity levels of laser light that vary with the frequency of the second source of electromagnetic radiation. The two photo detectors convert light variations at the locations into two electrical signals, so that by combining the two signal outputs, any amplitude-dependent noise present in the laser light at the locations of the photo detectors may be reduced or cancelled, without at the same time obliterating the signal that varies with the frequency of the second source of electromagnetic radiation.

In an atomic frequency standard of this invention, for example, the light output of a laser diode, which includes both AM and FM noise (that is, includes variations in both light intensity and light frequency), is directed into a microwave cavity, through a single atomic cell containing an atomic gas and onto two spaced photo detectors. The microwave cavity is also injected with a microwave input which is generated from the VCO frequency to provide a microwave field in the cavity that is frequency-modulated about the microwave selected reference frequency of the atomic gas. One of the photo detectors is located for exposure to the laser light passing through the atomic cell in a region where the microwave field intensity created by the microwave input generated from the VCO frequency is high, and the other photo detector is located for exposure to the laser light passing through the atomic cell in a region where the microwave field intensity created by the microwave input generated from the VCO frequency is low. Because the atomic gas density is substantially equal throughout the atomic cell, the optical transitions of the excited atomic gas due to the frequency variations of the optical pumping laser light create substantially equal variations in the absorption of the laser light by the atomic gas in both the high microwave field intensity region and the low microwave field intensity region of the atomic cell. Thus, though the variation in light absorption in both regions due to the FM noise of the laser diode creates an amplitude modulated noise on both photo detectors (each of whose signal output is dependent on the intensity of the light falling on the photo detector), the highly correlated amplitude-modulated noise generated by each photo detector due to the laser light FM noise is substantially equal, and any intensity variation (AM noise) in the optical pumping laser light that reaches the photo detectors is also converted into substantially equal AM noise. However, the difference in the microwave field intensities of the microwave input in the two regions of the atomic cell through which the laser light travels to reach the two photo detectors provides a high amplitude alternating current (ac) signal output from the photo detector associated with the high microwave field intensity region of the atomic cell and a low amplitude alternating current (ac) signal output from the photo detector associated with the low microwave field intensity region of the atomic cell. Subtraction of the output of the photo detector associated with the laser light passing through the region where the microwave field intensity is low from the output of the photo detector associated with the laser light passing through the region where the microwave field intensity is high results in substantial cancellation of the substantially equal noise due to AM and FM noise present in the laser light in both photo detector outputs while retaining a substantial ac signal for use in locking the VCO frequency to the selected reference frequency (natural atomic resonance) of the atomic gas.

In its most preferred embodiment, the invention provides an extremely small and inexpensive physics package for an atomic frequency standard combining a microwave cavity having non-critical dimensions that is driven in a substantially TEM mode by a lumped LC means, the cavity resonant frequency being primarily determined by the lumped LC means, an atomic gas cell carried by the cavity with a non-uniform microwave field established in the gas cell, a laser diode light source for direction of laser light through the atomic gas cell, and two photo detectors, one photo detector being located to receive laser light passing through the atomic gas cell at a higher intensity microwave field region and the other photo detector being located to receive light passing through the atomic gas cell at a lower microwave field intensity region.

Such a small and inexpensive physics package can produce from the noisy light of a single laser diode, a first signal output from the first photo detector, including a high amplitude alternating current (ac) signal with AM noise content, and a second signal output from the second photo detector, including a low amplitude alternating current (ac) signal with the same or substantially the same AM noise content as the first signal, and permits, by subtraction of the second output of the second photo detector from the first output of the first photo detector, a substantial reduction in or cancellation of the noise originating in the laser diode with a minimal reduction of the useful alternating current (ac) signal output.

The invention preferably uses the inherently divergent light output of a single laser diode directed through an optical attenuator at the atomic cell to excite the two regions of higher and lower microwave field intensity in the atomic cell, but the light output of the laser may also be collimated and split into two separated columnar beams directed through the two regions of the atomic cell.

Other features and advantages of the invention will be apparent to those skilled in the art from the drawings and more detailed description of its best-mode and the presently known preferred embodiments that follow.

DETAILED DESCRIPTION OF THE INVENTION

Figure 1:
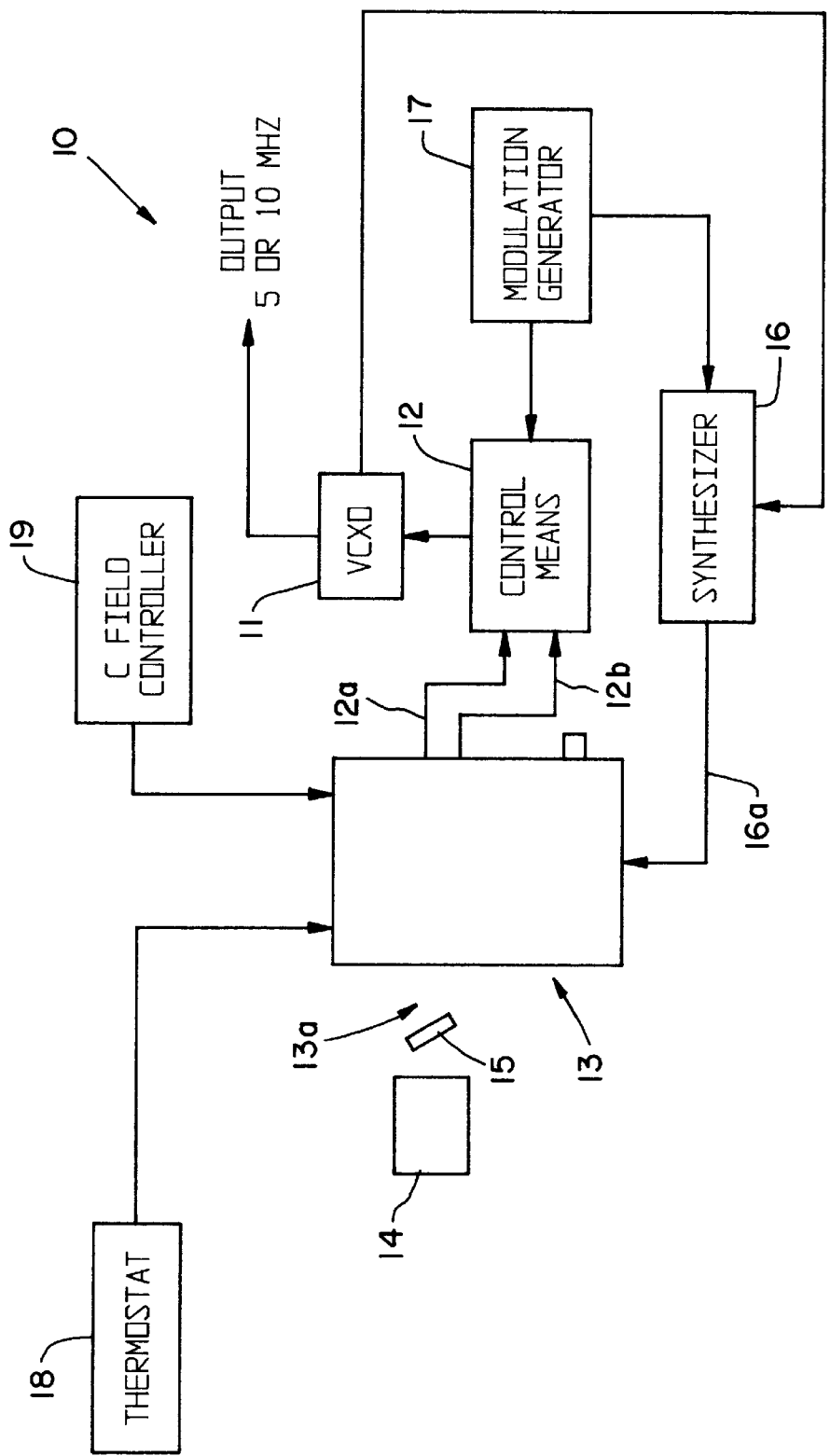
FIG. 1 is a simplified diagrammatic representation of an frequency standard system in which the invention may be used.

FIG. 1 is a simplified diagram of a rubidium atomic frequency standard of the type in which this invention may, for example, be used. As indicated in FIG. 1, such an atomic frequency standard 10 includes a physics package 13 which may advantageously include the invention, as illustrated in FIGS. 2–6 and described more fully below. The atomic frequency standard 10 includes a variable frequency voltage-controlled crystal oscillator (VCXO) 11 whose standard output frequency (e.g., 5 or 10 MHz) is controlled by a control means 12 in response to control output signals 12a and 12b from two photo detectors (not shown in FIG. 1) which are part of the physics package 13. The physics package 13 contains a transparent glass cell (not shown in FIG. 1) containing gaseous Rb-87 atoms. The atoms within the transparent gas cell are optically excited by laser light source 14. The laser light is directed through an optical attenuator 15 and then through a physics package aperture 13a and through the transparent glass cell to optically pump the Rb-87 atoms in the glass cell to their higher energy level; however, variations in the frequency of the laser light are converted by Rb-87 atoms into light variations, creating amplitude-modulated (AM) noise on the outputs of the two photo detectors. The invention, as described below, provides cancellation of the AM noise due to variations in the intensity and frequency of the laser light.

The atomic frequency standard 10 also includes a frequency synthesizer 16 which generates, from the standard output frequency of VCXO 11, a microwave frequency corresponding to the ground-state hyperfine transition frequency for Rb-87, i.e. 6.834 GHz, the atomic resonance frequency of the Rb-87 atoms, and frequency modulates the microwave energy about the hyperfine transition frequency with a modulation generator 17. U.S. Pat. No. 5,721,514 issued Feb. 24, 1998 discloses the synthesis of such a frequency-modulated microwave input. The frequency-modulated microwave energy is applied to the physics package 13, (as indicated at 16a) and induces transitions of the Rb-87 atoms between energy levels with resultant amplitude-modulated intensity of light absorption and ac electrical signal outputs 12a and 12b of the two photo detectors. The electrical signal outputs 12a and 12b are combined by the control means 12 for cancellation of the AM noise on the signal outputs 12a and 12b due to variations in the laser light from source 14 while retaining a substantially useable ac signal for use in controlling the VCXO 11. The use of such a resultant ac signal and the associated circuitry of control means 12 are well known in the art.

In the typical atomic frequency standard 10 of FIG. 1, a thermostat 18 is used to stabilize the temperature of the physics package 13 in an effort to avoid the effects of temperature variation. In addition, a C-field current controller circuit 19 is typically employed to provide a static magnetic field, known in the art as the "C-field", to magnetically bias the atomic glass in the glass cell and separate the Zeeman levels of the hyperfine states of the atomic gas.

As illustrated by FIGS. 2–5, a preferred embodiment of the physics package 13 includes a subminiature electrically conductive enclosure 21 defining a microwave cavity 20 with a lumped LC means 22, described in greater detail below, that can be excited, at the atomic transition frequency (the selected reference frequency) of the Rb-87 atoms in the glass cell 30. Upon excitation, a non-uniform microwave magnetic field is established in glass cell 30. The cavity 20 includes two spaced photo detectors 29 and 31. The first photo detector 29 is located adjacent a first portion 30h of the gas cell 30 where the intensity of the frequency-modulated microwave magnetic field created in the glass cell 30 is higher and the second photo detector is located adjacent a second portion 30l of the gas cell 30 where the intensity of the frequency-modulated microwave magnetic field is lower. The laser light from the laser light source 14 diverges from laser light source 14 and transits an optical attenuator 15, which is used to avoid interference from light reflected by the glass cell 30 and cavity-forming enclosure means 21. The divergent laser light then passes through opening 13a, with a first light portion transiting the first portion 30h of the glass cell and being received by the first photo detector 29 and a second light portion transiting the second portion 30l of the glass cell and being received by the second photo detector 31.

The light output of a laser diode 14, which includes both AM and FM noise (that is, includes variations in both light intensity and light frequency), is thus directed into a microwave cavity 20, through a single atomic cell 30 containing an atomic glass and onto two spaced photo detectors 29 and 31. The microwave cavity 20 is also injected with the microwave input 16a which has been generated from the VCXO frequency to provide a non-uniform microwave magnetic field within the atomic glass cell 30 that is frequency-modulated about the atomic resonance frequency of the Rb-87 atoms. One of the photo detectors 29 is located for exposure to the laser light passing through the atomic cell in a region 30h where the microwave magnetic field intensity created by the frequency-modulated microwave input generated from the VCXO 11 is high, and the other photo detector 31 is located for exposure to the laser light passing through the atomic cell in a region 30l where the microwave magnetic field intensity created by the frequency-modulated microwave input generated from the VCXO 11 is lower. Because the atomic glass density is substantially equal throughout the atomic cell 30, the optical transitions of the excited atomic glass due to the frequency variations of the optical pumping laser light create substantially equal variations in the absorption of the laser light in both the high microwave magnetic field intensity region 30h and the low microwave magnetic field intensity region 30l of the atomic cell 30. Thus, though the variations in light absorption in both regions 30h and 30l due to the FM noise of the laser diode 14 create an amplitude modulated noise on both photo detectors 29 and 31 (each of whose signal outputs is dependent on the intensity of the light falling on the photo detector), the amplitude-modulated noise due to the laser light FM noise is substantially equal and any intensity variation (AM noise) in the optical pumping laser light that reaches the photo detectors 29 and 31 is converted into substantially equal AM noise. However, the difference in the microwave field intensities of the microwave input in the two regions 30h and 30l of the atomic cell 30 through which the laser light travels to reach the two photo detectors 29 and 31 provides a high amplitude ac signal output from the first photo detector 29 associated with the high microwave field intensity region 30h of the atomic cell 30 and a low amplitude ac signal output from the second photo detector associated with the low microwave field intensity region 30l of the atomic cell 30.

The control means 12 includes electronic circuit means, which will be well known to those skilled in the art, to combine the outputs of the first photo detector 29 and second photo detector 31 to reduce or cancel the unwanted AM noise portions of their outputs that are due to the laser light diode 14. For example, because the AM noise portions of the signal outputs 12a and 12b from the first photo detector 29 and second photo detector 31 that are due to FM and AM noise of the laser light source 14 are substantially equal, subtraction of the second signal output 12b from the first signal output 12a will substantially reduce or cancel this noise from the combined output while retaining a substantial portion of the ac signal for use in controlling the frequency at VCXO 11.

Figure 3:
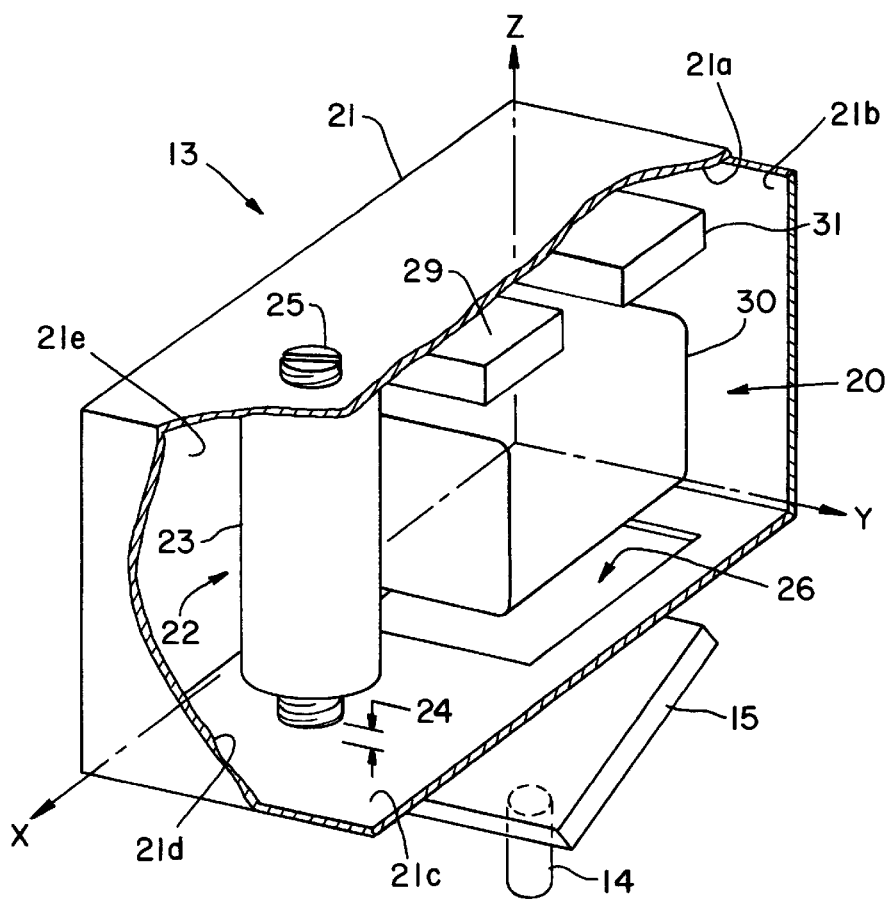
FIG. 3 is a perspective view of the invention with the microwave cavity of the physics package partially broken away to illustrate its interior.

In its most preferred embodiment illustrated, for example, by FIG. 3, the invention provides an extremely small and inexpensive physics package for an atomic frequency standard combining a microwave cavity 20 having non-critical dimensions that is driven in a substantially TEM mode by a lumped LC means 22, the cavity resonant frequency being primarily determined by the lumped LC means, an atomic glass cell 30 carried by the cavity with a non-uniform microwave magnetic field established in the glass cell, a laser diode light source 14 for direction of laser light through the atomic glass cell and two photo detectors 29 and 31, one photo detector 29 being located to receive laser light passing through the atomic glass cell at a higher intensity microwave magnetic field region and the other photo detector 31 being located to receive laser light passing through the atomic glass cell at a lower microwave magnetic field intensity region.

In the illustrative embodiments of FIGS. 2–6, a resonant cavity 20 is formed by an electrically conductive enclosure 21 that provides the electrically conductive cavity walls. In the embodiments shown in FIGS. 2–6, the electrically conductive means 21 forms the walls of the microwave cavity 20 in the form of a right parallelepiped. The cavity walls which are not cut away in FIG. 3 have been provided element numbers 21a–21e, wall 21f having been cut away to illustrate the interior of the microwave cavity 20. As indicated above, the dimensions of the walls 21a–21f are not critical in the invention as the resonant frequency of the microwave cavity is determined primarily by the lumped LC means 22.

Figure 4:
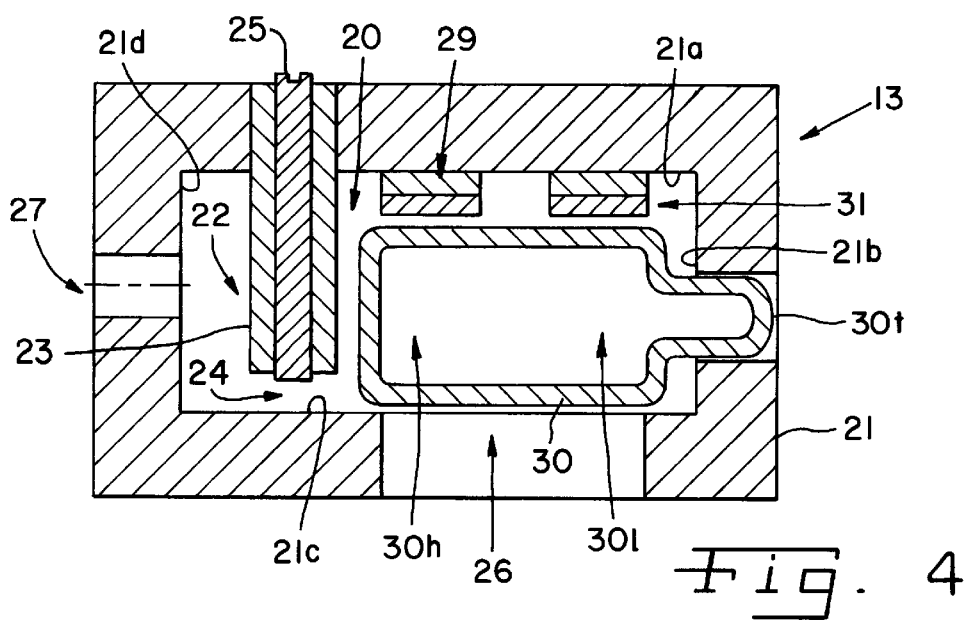
FIG. 4 is a cross sectional view of the microwave cavity of FIG. 3 taken at a plane parallel to the XZ plane of FIG. 3.

The lumped LC means 22 in the preferred embodiment illustrated in FIGS. 2–6 comprises an electrically conductive rod 23 connected at one end to wall 21a of the electrically conductive means 21 and extending partially across the cavity in the direction of wall 21c and forming, between its distal end and wall 21c, a gap indicated by the space numbered 24 in FIGS. 3 and 4. In the embodiment illustrated in FIGS. 3–5, lumped LC means 22 is provided with a second electrically conductive rod 25 adjustably carried by rod 23 to permit adjustment of the gap 24. In the embodiment illustrated in FIGS. 3–5, the adjustable electrically conductive rod 25 may be a screw, or screw portion, threadedly carried by rod 23 so that upon turning of the screw 25, the gap 24 between its end and wall 21c of the electrically conductive means 21 may be adjusted.

The resonant frequency of a microwave cavity 20 is determined primarily by the inductance and capacitance provided by the lumped LC means 22 within the cavity. As will be apparent to those skilled in the art, the inductance of the lumped LC means will be determined by the dimensions of rod 23, primarily its diameter, and the capacitance will be determined primarily by the diameter of the rod 23 and the length of the gap 24. In the illustrated embodiments of FIGS. 3–5, the resonance presented by the lumped LC means and its inductance and capacitance can be varied by adjustment of the threaded electrically conductive element 25. While FIGS. 2 and 6 do not illustrate the adjustable element 25, the embodiments illustrated in FIGS. 2 and 6 can be provided with such an adjustable element.

The preferred form 20 of microwave cavity and lumped LC means is the modified coaxial cavity operating in a substantially TEM mode, with the center conductor (23) shorted to the cavity walls (21a) at one end and not touching the cavity walls (21c) at the other end. It is conceptually as if the outer conductor of a coaxial cavity has been deformed to change it from a circular to a rectangular cross section and as if the center conductor has been moved away from the center of the cavity in a direction perpendicular to the axis of the center conductor. Such a modification permits a microwave cavity having non-critical dimensions and operable in a substantially TEM mode and carrying a transparent cell 30 at the end of the cavity opposite the lumped LC means 22, as illustrated in FIGS. 2–6.

As discussed above, the invention permits noise cancellation from a laser light source by adding only an additional photo detector to a physics package. As further illustrated in FIGS. 2–6, the microwave cavity 20 can contain and carry photo detectors 29 and 31 at one side of the optically transparent glass cell 30, and the electrically conductive enclosure means 21 is further provided with an opening or aperture 26 formed on optical axes which include the transparent cell 30 and photo detectors 29 and 31. The optical axes lie generally in the direction of the Z axis as illustrated in FIG. 3.

The magnetic field components of the injected microwave energy lie generally in planes parallel to the plane including the X and Y axes of FIG. 3. The microwave magnetic field passes through glass cell 30 in a direction substantially perpendicular to the light, which is generally in the direction of the Z axis. In addition, this embodiment of the invention provides a small cavity having a highly loaded Q of 300 to 400, reducing the amount of microwave power required for satisfactory operation.

The microwave cavity 20 of this invention may be provided with static magnetic C-field by a C-field coil (not shown) which can be provided inside the cavity, or outside the electrically conductive enclosure 21 if the electrically conductive means 21 is formed by a non-magnetic electrically conductive material. It is strongly preferred that the C-field coil (or other means providing the static magnetic field) provide a static magnetic field substantially parallel with the microwave magnetic field in the region where the glass cell is located, that is, with static magnetic lines lying generally in planes parallel to the plane including the X and Y axes, so that the microwave magnetic field and static magnetic field are in planes substantially perpendicular to the optical axes (which are parallel to the Z axis). In such an arrangement, the plane of the light hole will be substantially parallel to the direction of the C-field which is very unusual for small atomic standards. Such an arrangement will improve the efficiency of optical pumping of the glass in the glass cell and the short term stability of the atomic frequency standard. Those skilled in the art will be able to provide C-field means as described above.

Figure 5:
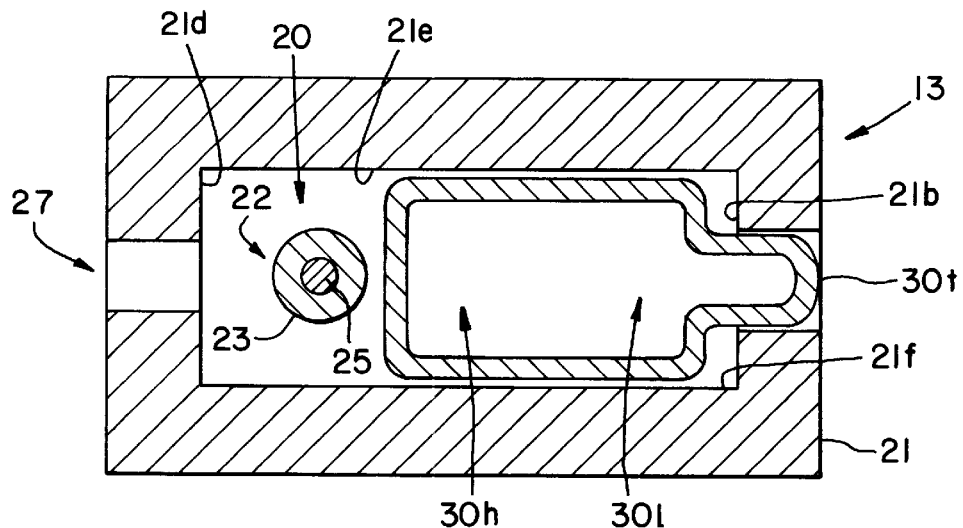
FIG. 5 is a cross sectional view from above the microwave cavity of FIG. 3 taken at a plane parallel to the XY plane of FIG. 3.

FIGS. 4 and 5 are orthogonal views of the physics package illustrated in FIG. 3, FIG. 4 being a cross-sectional view taken at a plane parallel to the XZ plane of FIG. 3 and FIG. 5 being a cross-sectional view taken at a plane parallel to the XY plane of FIG. 3. As further illustrated by FIGS. 4 and 5, the electrically conductive enclosure 21 of the microwave cavity may have an opening formed in its end 21b to accept a tip-off portion 30t of glass cell 30. FIG. 4 illustrates the light opening 26 formed in wall 21c and its location to admit the laser light through portions 30h and 30l of the transparent cell 30 along optical axes including the photo detectors 29 and 31. FIG. 4 also illustrates that the metallized rear surfaces of the preferred photo detectors 29 and 31, such as the preferred silicon photo diodes, may be located immediately adjacent and fastened to a portion of wall 21a of the microwave cavity. FIG. 4 further illustrates the gap 24 which is adjustable by the threaded screw 25. In some embodiments of this invention the lumped LC means may comprise a varactor located in gap 24 to substantially provide the lumped capacitance of the lumped LC means 22.

FIGS. 4 and 5 also illustrate that an opening 27 may be provided in wall 21d of the enclosure means 21 to admit means for the injection of the microwave energy into the microwave cavity 20. Such a microwave energy injection means may be an E-field probe from a microwave frequency synthesizer, diagrammatically shown in FIG. 1 as element 16, or other microwave means known in the art.

Figure 2:
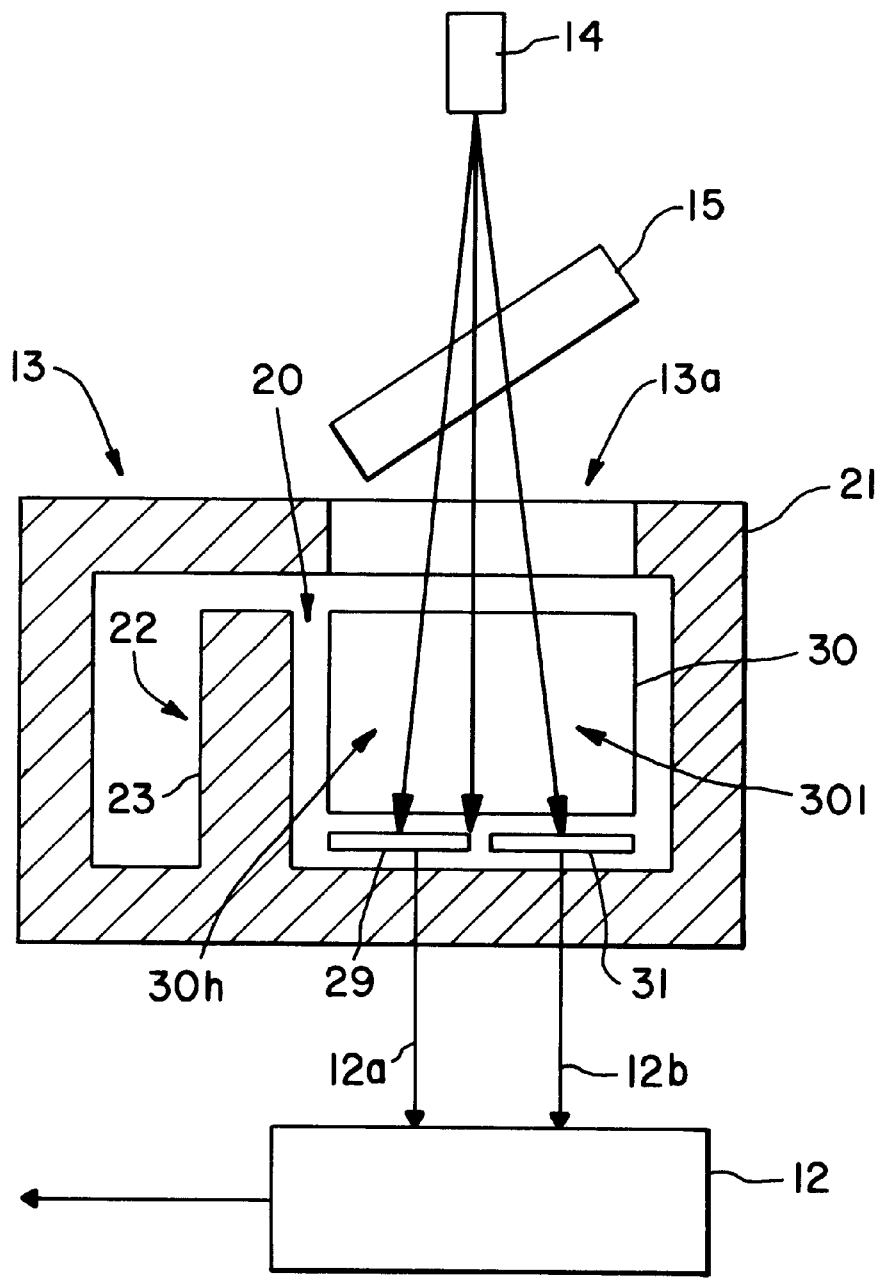
FIG. 2 is a diagrammatic representation of one embodiment of the invention.
Figure 6:
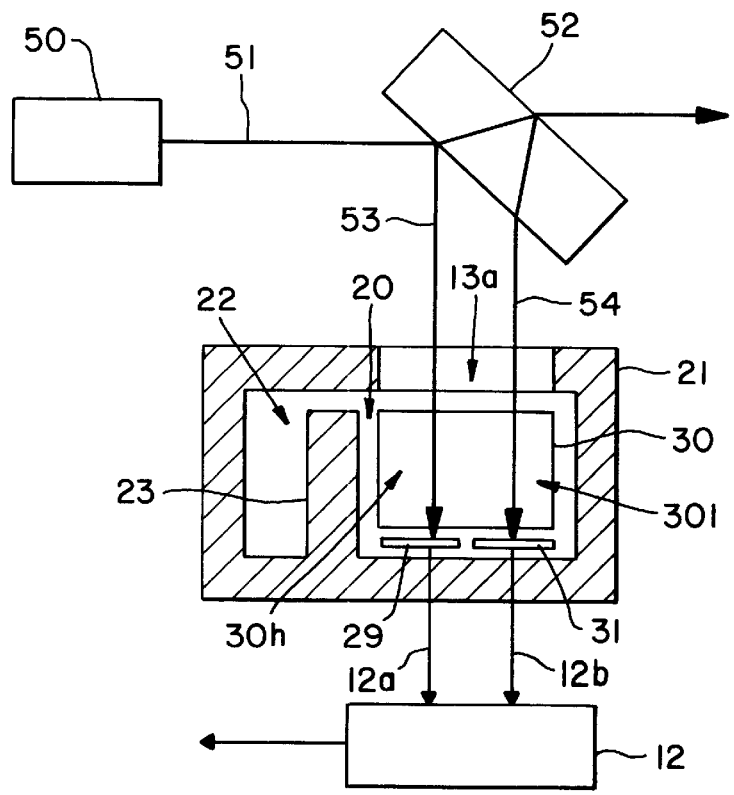
FIG. 6 is a diagrammatic representation of another embodiment of the invention.

FIG. 6 illustrates another embodiment of the invention which differs from the embodiment of FIG. 2 by the light source. Rather than using only a laser diode, which produces an uncollimated light beam, the embodiment of FIG. 6 uses a laser diode plus collimating optics as the light source 50 providing a collimated laser light beam 51 which is split by a beam splitter 52 into two columnar laser light beams 53 and 54, one of which (53) is directed through the first portion 30h of glass cell 30 onto the first photo detector 29 and the second of which (54) is directed through the second portion 30l of the glass cell 30 onto the second photo detector 31. The resulting first signal 12a and second signal 12b are combined, or subtracted as described above to reduce or cancel noise present in the laser light.

The electrically conductive enclosure means 21 is illustrated diagrammatically in the drawings. Although the drawings illustrate the microwave cavity 20 formed as a right parallelepiped, the cavity 20 may have other forms. The enclosure means 21 may be formed with any suitable electrically conductive material, such as zinc or aluminum, and because of the non-criticality of its dimensions may be formed by such manufacturing methods as extrusion, stamping, casting and the like. An accurate machining of the cavity 20 to maintain critical dimensions is not necessary in the invention.

In addition, the microwave cavity 20 may be formed from one or more pieces connected together to form the electrically conductive enclosure 21. The lumped LC means may be one or more rods of electrically conductive material that are shorted, i.e., connected, at one end to the walls of the electrically conductive enclosure means 21 or may be provided by a length of wire adjustably carried within the microwave cavity.

The electrically conductive enclosure means 21 preferably used in the invention includes a five-sided enclosure and a flat lid (e.g., the side of the enclosure that has been completely removed in FIG. 3 to allow the interior of the enclosure to be seen). The flat lid can be stamped out of thin copper or aluminum sheet. The five-sided enclosure can be milled out of conductive material such as aluminum, copper or brass, or it can be die cast zinc. The lid can be fastened to the rest of the enclosure using solder or silver-filled epoxy adhesive. The rods 23, 25 may be fabricated out of brass using a screw machine. The rod 23 can be fabricated with an external thread by which it can be screwed into a mating threaded hole in the enclosure 21. The parts can be plated with gold or some equivalent material that provides a highly reflective surface at the wavelength of the pumping light (780 and 795 nm for Rb-87 atoms) and which prevents significant deterioration of the reflectance over the life time of the standard, at the operating temperature of the cavity.

As described above, in this invention, a quantum medium, such as Rb or Cs vapor, that can be optically excited by laser light to one or more energy levels is excited by a source of laser light (14) into one of its higher energy states, and is exposed to a second source of electromagnetic radiation, such as an interrogating microwave electromagnetic field, which excites optically-detectable atomic transitions at selected microwave reference frequencies of the quantum medium, the microwave field being non-uniform in the medium in a direction transverse to the passage of laser light through the quantum medium. The laser light that has passed through the medium is detected at two locations directionally transverse to the passage of laser light by photo detectors (29, 31), one location having higher intensity of laser light whose intensity varies with the frequency of the microwave field and the second location having a lower intensity of laser light whose intensity varies with the frequency of the microwave field. The two photo detectors (29, 31) convert the signals generated by light variations at the two locations into two electrical signals (12a, 12b) and any noise present in the laser light may be reduced or cancelled by combining the two signal outputs.

As described above, particularly preferred embodiments of the invention include means forming a microwave cavity (20) usable in an atomic frequency standard or other quantum frequency apparatus comprising an electrically conductive cavity-forming enclosure (21), having one or more light openings (26) at one end that provide optical axes for light into or through the cavity, and having a tuning rod (23) extending into the cavity adjacent the other end in a direction that is substantially parallel to the optical axes and providing, with a wall of the electrically conductive closure (21), a lumped inductance and capacitance resonant at a selected reference frequency so that the cavity and rod cooperate at the selected reference frequency to operate the cavity in a substantially TEM mode with its microwave magnetic field substantially perpendicular to the optical axis between the rod and the end forming the optical axis.

As an example of the small size achievable with this invention, the illustrative embodiment of FIGS. 2–6 can be made for a rubidium atomic frequency standard with the following dimensions:

The length of the cavity enclosure, i.e., the length of walls 21a, 21c, 21e and 21f=0.574 inches.

The width of the cavity enclosure, i.e., the width of walls 21a and 21c=0.300 inches.

The height of the cavity enclosure, i.e., the height of walls 21e and 21f=0.355 inches.

The diameter of rod 23=0.125 inches.

The length of rod 23=0.330 inches.

The length of gap 24=0.025 inches

The length of glass cell 30, excluding the tip off portion 30t=0.475 inches.

The width and height of the glass cell 30=0.260 inches.

The length of aperture 26=0.400 inches.

The width of aperture 26=0.200 inches.

Embodiments and modifications other than the presently preferred embodiments described above may be made without departing from the scope of the invention as defined in the claims that follow.

I claim:

1. A laser light atomic frequency standard, comprising:
 a transparent cell containing an atomic glass excitable at an atomic resonance frequency;
 means for forming a non-uniform frequency-modulated microwave field in the transparent cell, said frequency-modulated microwave field having a first region of higher field intensity and a second region of lower field intensity in the atomic gas in the gas cell;

a laser light source directed through the transparent cell;

two photo detectors located to receive the laser light directed through the transparent cell, the first photo detector being located to receive laser light directed through said first region for generation of a first signal output and the second photo detector being located to receive laser light directed through said second region for generation of a second signal output; and means for combining said first signal output and second signal output for cancellation of noise generated in the light transmitted through said atomic gas.

2. The atomic frequency standard of claim 1 further comprising an optical attenuator located between the laser light source and the transparent cell through which the laser light is directed.

3. The atomic frequency standard of claim 1 further comprising means for providing a collimated laser light beam, and a beam splitter for splitting the collimated laser light beam into a first beam directed through the first higher microwave field intensity region in the atomic gas and at the first photo detector and a second beam directed through the second lower microwave field intensity region in the atomic gas and at the second photo detector.

4. The atomic frequency standard of claim 1, wherein the means for forming a non-uniform frequency-modulated microwave field in the transparent cell comprises a microwave cavity carrying the transparent cell at one end, and a lumped LC means within the microwave cavity at its other end.

5. The atomic frequency standard of claim 4, wherein lumped LC means creates a microwave field operating in the TEM mode with its microwave magnetic field substantially perpendicular to the laser light in both the first higher and second lower microwave field intensity regions in the atomic gas.

6. The atomic frequency standard of claim 4, wherein the lumped LC means comprises an electrically conductive tuning rod carried by the microwave cavity and forming a lumped inductance and a lumped capacitance.

7. The physics package of claim 6 wherein the tuning rod comprises a round rod extending from one wall of the microwave cavity and terminating to form a gap adjacent another wall of the microwave cavity.

8. The atomic frequency standard of claim 1 wherein the laser light source is a laser light emitting diode.

9. A reduced noise laser light quantum system, comprising:

a quantum medium optically excitable by laser light;

a source of laser light directed at said medium for exciting the medium;

a second source of coherent electromagnetic radiation exciting an optically detectable selected reference frequency of the quantum medium, said second source of electromagnetic radiation providing greater radiation intensity in a first medium portion and lesser radiation intensity in a second medium portion;

a first photo detector located to receive laser light passing through the first medium portion and for generating a first electrical output;

a second photo diode located to receive laser light passing through the second medium portion and for generating a second electrical output; and an electrical circuit for combining the first electrical output and the second electrical output for reduction of any noise generated as a result of laser light noise.

10. The reduced noise laser light quantum system of claim 9 wherein the medium is a gas of rubidium atoms and the second source of electromagnetic radiation is a microwave energy source providing frequency modulation about a frequency equal to an atomic transition frequency of the rubidium atoms.

11. The reduced noise laser light quantum system of claim 9 wherein the medium is a gas of cesium atoms and the second source of electromagnetic radiation is a microwave energy source providing frequency modulation about a frequency equal to an atomic transition frequency of the cesium atoms.

12. The reduced noise laser light quantum system of claim 9 wherein the quantum medium is carried in a microwave cavity, the source of laser light is directed at the quantum medium through an opening in the microwave cavity and the second source of electromagnetic radiation is a microwave input to the microwave cavity at an optically detectable selected reference frequency.

13. The reduced noise laser light quantum system of claim 12 wherein the microwave cavity comprises:

an electrically conductive cavity-forming enclosure having said opening in one side of the cavity forming an optical axis for the laser light directed at the quantum medium adjacent one end thereof, and having a rod extending into the cavity adjacent the other end thereof in a direction substantially parallel to said optical axis, and providing, with the electrically conductive body a lumped LC resonant at the selected reference frequency;

said cavity and rod cooperating at the selected reference frequency to provide a microwave magnetic field substantially perpendicular to said optical axis and between said tuning rod and said one end.

14. The means of claim 13, wherein said cavity and tuning rod cooperate to provide a microwave cavity operating in a substantially TEM mode.

15. The means of claim 13 wherein the rod carries adjustably a second electrically conductive element that is axially adjustable to adjust the lumped LC.

16. The means of claim 13 wherein the electrically conductive cavity-forming enclosure carries means forming a static magnetic C field portion that is substantially parallel to the microwave magnetic field formed by the tuning rod within the cavity.

17. A physics package for an atomic frequency standard, comprising:

a laser light source;

an electrically conductive means forming a microwave cavity operable at about an atomic gas reference frequency and including an aperture for the admission of laser light into the cavity;

an optically transparent atomic cell carried within and at one end of the cavity and providing an atomic gas excitable at the atomic gas reference frequency;

means for providing a non-uniform microwave magnetic field having a region of reduced magnetic field intensity in the optically transparent atomic cell;

first and second photo detectors carried within the cavity adjacent one side of the optically transparent atomic cell, said second photo detector being located adjacent the region of reduced magnetic field intensity;

said aperture for admission of light formed in the electrically conductive means, said optically transparent atomic cell and said first and second photo detectors forming optical axes in the microwave cavity; and lumped LC means within the microwave cavity and resonant, when excited by microwave energy at the atomic gas reference frequency, to provide said non-uniform microwave magnetic field in the optically transparent atomic cell substantially perpendicular to the optical axes.

18. The physics package of claim 17 wherein the lumped LC means comprises an electrically conductive rod carried by said electrically conductive means extending into the cavity and forming a gap within the cavity.

19. The physics package of claim 18 wherein the electrically conductive rod comprises an electrically conductive rod adjustably carrying a second conductive element for adjustment of the inductance and capacitance.

20. The physics package of claim 19 wherein the electrically conductive rod has a substantially round cross section and the second conductive element is threadedly engaged with the electrically conductive rod to permit adjustment of the gap.

21. The physics package of claim 18 wherein the electrically conductive rod has a central axis substantially parallel to said optical axes.

22. The physics package of claim 18 wherein the electrically conductive rod comprises two rod portions, each of the rod portions extending from opposing sides of the cavity with a gap therebetween.

23. The physics package of claim 17 further comprising means for providing a static magnetic C-field in the optically transparent atomic cell wherein the plane of the aperture for admission of light is substantially parallel to the direction of the static magnetic field in the atomic cell.

24. The physics package of claim 23 wherein the directions of the microwave magnetic field and static magnetic field are substantially parallel in the optically transparent atomic cell.

25. A method of reducing noise attributable to a laser light source in a quantum system, comprising:

providing a body of a quantum medium;

directing laser light through the quantum medium, said laser light exciting the quantum medium;

generating an interrogating electromagnetic field in the quantum medium with regions of higher and lower field intensity;

detecting the intensity of the laser light transiting the quantum medium in the region of higher field intensity of the interrogating electromagnetic field for generation of a first electrical signal, and in the region of the lower field intensity of the interrogating electromagnetic field for generation of a second signal; and combining the first and second signals for cancellation of noise due to variations of frequency and intensity of the laser light while retaining a signal portion generated by the interrogating electromagnetic field.

* * * * *